United States Patent [19]
MacKenzie

[11] Patent Number: 5,805,397
[45] Date of Patent: Sep. 8, 1998

[54] ARCING FAULT DETECTOR WITH MULTIPLE CHANNEL SENSING AND CIRCUIT BREAKER INCORPORATING SAME

[75] Inventor: Raymond Warren MacKenzie, Pittsburgh, Pa.

[73] Assignee: Eaton Corporation, Cleveland, Ohio

[21] Appl. No.: 939,974

[22] Filed: Sep. 29, 1997

[51] Int. Cl.⁶ .................................................. H02H 3/00
[52] U.S. Cl. ............................................. 361/42; 361/93
[58] Field of Search .................................. 361/42, 49–50, 361/93, 100–102, 111, 113; 335/201; 324/520, 522, 76.45; 364/483, 484

[56] References Cited

U.S. PATENT DOCUMENTS

| | | | |
|---|---|---|---|
| 4,376,243 | 3/1983 | Renn et al. | 219/514 |
| 4,949,214 | 8/1990 | Spencer | 361/95 |
| 5,142,234 | 8/1992 | Snead | 324/536 |
| 5,185,684 | 2/1993 | Beihoff et al. | 361/45 |
| 5,224,006 | 6/1993 | MacKenzie et al. | 361/45 |
| 5,245,498 | 9/1993 | Uchida et al. | 361/47 |
| 5,307,230 | 4/1994 | MacKenzie | 361/96 |
| 5,452,223 | 9/1995 | Zuercher et al. | 364/483 |
| 5,459,630 | 10/1995 | MacKenzie et al. | 361/45 |
| 5,519,561 | 5/1996 | Mrenna et al. | 361/105 |

*Primary Examiner*—Jeffrey A. Gaffin
*Assistant Examiner*—Michael J. Sherry
*Attorney, Agent, or Firm*—Martin J. Moran

[57] ABSTRACT

Arcing faults are detected by a multi-channel arc fault detector in which each channel includes a bandpass filter having an assigned discrete passband which is non-overlapping with the passband of any of the other bandpass filters. Thus, the detector can discriminate an arcing fault which produces white noise and therefore generates an output from all of the bandpass filters simultaneously from a carrier signal which will only produce an output from one bandpass filter. The output of the individual bandpass filters can be ANDed, for example, by comparators with a common pull up resistor, or by analog multipliers. The output of the arcing fault detector can be used to trip a circuit breaker.

14 Claims, 4 Drawing Sheets

ARCING FAULT DETECTOR WITH MULTIPLE CHANNEL SENSING AND CIRCUIT BREAKER INCORPORATING SAME

BACKGROUND OF THE INVENTION

1. Field of the Invention

This invention relates to detection and interruption of currents in electric power systems experiencing arcing faults. More particularly, it relates to apparatus which responds to the arcing faults while rejecting false arc indications due to other phenomena such as carrier signals on the power lines.

2. Background Information

Arcing faults can occur in electrical systems for instance between adjacent bared conductors, between exposed ends of broken conductors, at a faulty connection, and in other situations where conducting elements are in close proximity. Arcing faults typically have high resistance so that the arc current is below the instantaneous or magnetic trip thresholds of conventional circuit breakers. Also, the arcing fault creates an average RMS current value which is below the thermal threshold for such circuit breakers. Even so, the arcs can cause damage or start a fire if they occur near combustible material. It is not practical to simply lower the pickup currents on conventional circuit breakers as there are many typical loads which draw similar currents, and would therefore cause nuisance trips.

One approach to arc fault detection employs the sensing of high frequency energy created by the arc. However, such arc fault detectors are subject to false indications of arcing due to carrier signals which may be present on the power line. These power line carrier signals may be from equipment located on the premises, or may be from equipment used by the electric utility, such as for load shedding. It is known in the art that some of these carrier signals may be rejected by ignoring those which are not modulated at a harmonic of the power line frequency, as arcing sources always are modulated at a harmonic of the power line frequency. Thus, wireless intercoms and infant monitors are easily rejected. However, some power line carriers used for control purposes may be intentionally modulated at a harmonic of the power line frequency.

There is a need for improved arc fault detectors and circuit breakers incorporating the same which are not subject to false arcing indications due to carrier signals on the power lines.

There is a further need for such arc fault detectors in circuit breakers which are simple and reliable and therefore cost effective.

SUMMARY OF THE INVENTION

These needs and others are satisfied by the invention which recognizes that an arcing fault causes broad band noise whereas the carrier signals have discrete frequencies. The arcing fault detecting means and circuit breakers incorporating the same in accordance with the invention employ multiple channels each having a bandpass filter with an assigned, non-overlapping passband. Thus, a carrier signal will produce an output in only one of the bandpass filters while an arcing fault will generate an output in all of the bandpass filters. By ANDing the outputs of the bandpass filters so that an arcing fault indication is only generated when outputs from all of the bandpass filters are detected simultaneously, false arcing indications due to carrier signals on the power lines are avoided.

In the simplest form, two channels will eliminate false arc indications from a single carrier signal. To assure avoidance of a false arc indication when multiple carrier signals can be present, one more channel than the expected number of carrier signals is required.

More particularly, the invention is directed to apparatus for detecting arcing faults in electric power systems subject to carrier signals, which includes sensing means for sensing the current in the power system, multiple channels, with each channel having a bandpass filter with an assigned non-overlapping passband, and output means which generates an arcing fault signal only when all of the bandpass filters generate an output simultaneously. In a preferred form of the invention, a common bandpass amplifier, which has a passband spanning the passbands of all of the bandpass filters, can be used to apply gain to the sensed signal before it is applied to the individual bandpass filters.

Also preferably the output means includes ANDing means which ANDs the outputs of the detectors in each channel to produce an ANDed signal. Preferably, the output means includes means generating a time attenuated accumulation of the ANDed signal to preclude false trips on transient broadband impulses. Also, low pass filters may be provided before and/or after the ANDing means to discriminate against transient impulses.

The ANDing means can comprise comparators which compare the detector outputs with reference values, and a common pull up resistor connected to the output of the comparators. As one alternative, analog multiplier means can be used to perform the ANDing function.

The invention embraces the arc detection apparatus as well as a circuit breaker incorporating such apparatus.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention will be described as applied to a miniature circuit breaker such as that described in U.S. Pat. No. 4,081,852 which is hereby incorporated by reference. That circuit breaker incorporates a thermal-magnetic trip device comprising a bimetal and a magnetic armature which unlatch a spring driven trip mechanism to open the contacts in response to a persistent overcurrent and a short circuit current, respectively. The circuit breaker of U.S. Pat. No. 4,081,852 includes a ground fault detector which can be replaced by, or be used in addition to, the arcing fault detector which forms part of the present invention.

Figure 1:
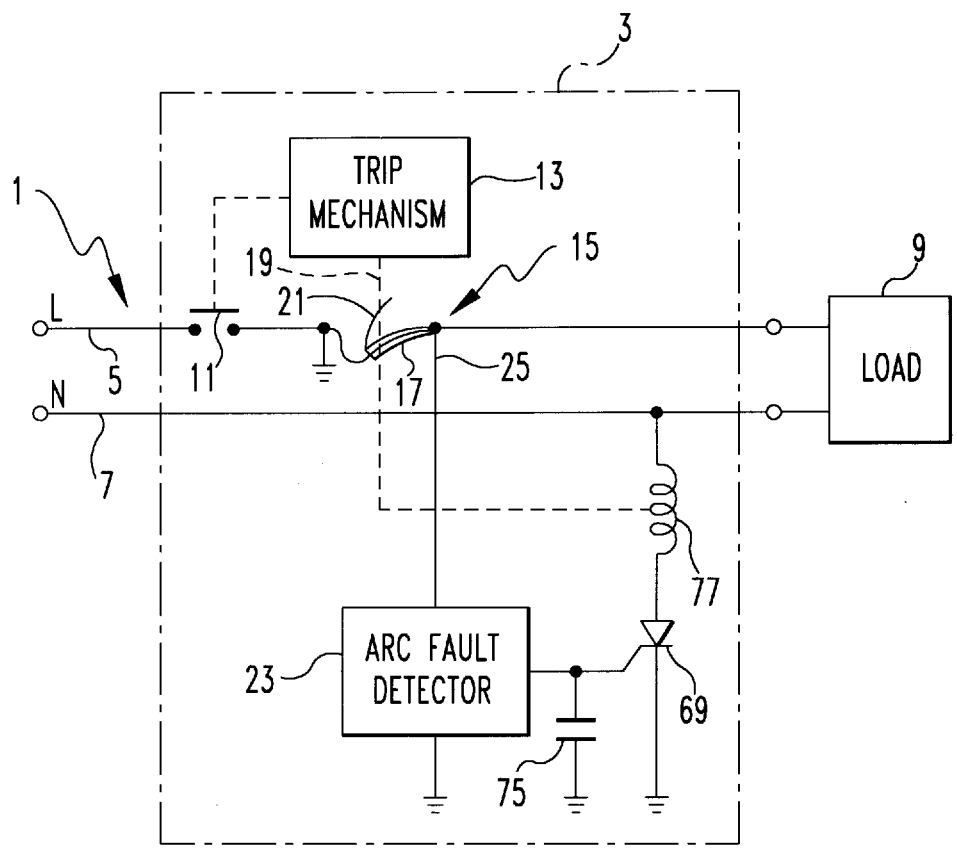
FIG. 1 is a schematic diagram in block form of a circuit breaker in accordance with the invention providing protection in an electric power distribution system.

Turning to FIG. 1, the electrical system 1 protected by the circuit breaker 3 includes a line conductor 5 and a neutral conductor 7 connected to provide power to a load 9. The circuit breaker 3 includes separable contacts 11 which can be tripped open by a spring operated trip mechanism 13. The trip mechanism may be actuated by a conventional thermal-magnetic overcurrent device 15. This thermal-magnetic overcurrent device 15 includes a bimetal 17 connected in series with the line conductor 5. Persistent overcurrents heat up the bimetal 17 causing it to bend and release a latch 19 which actuates the trip mechanism 13. Short circuit currents through the bimetal 17 magnetically attract an armature 21 which alternatively releases the latch 19 to actuate the trip mechanism 13.

Figure 2:
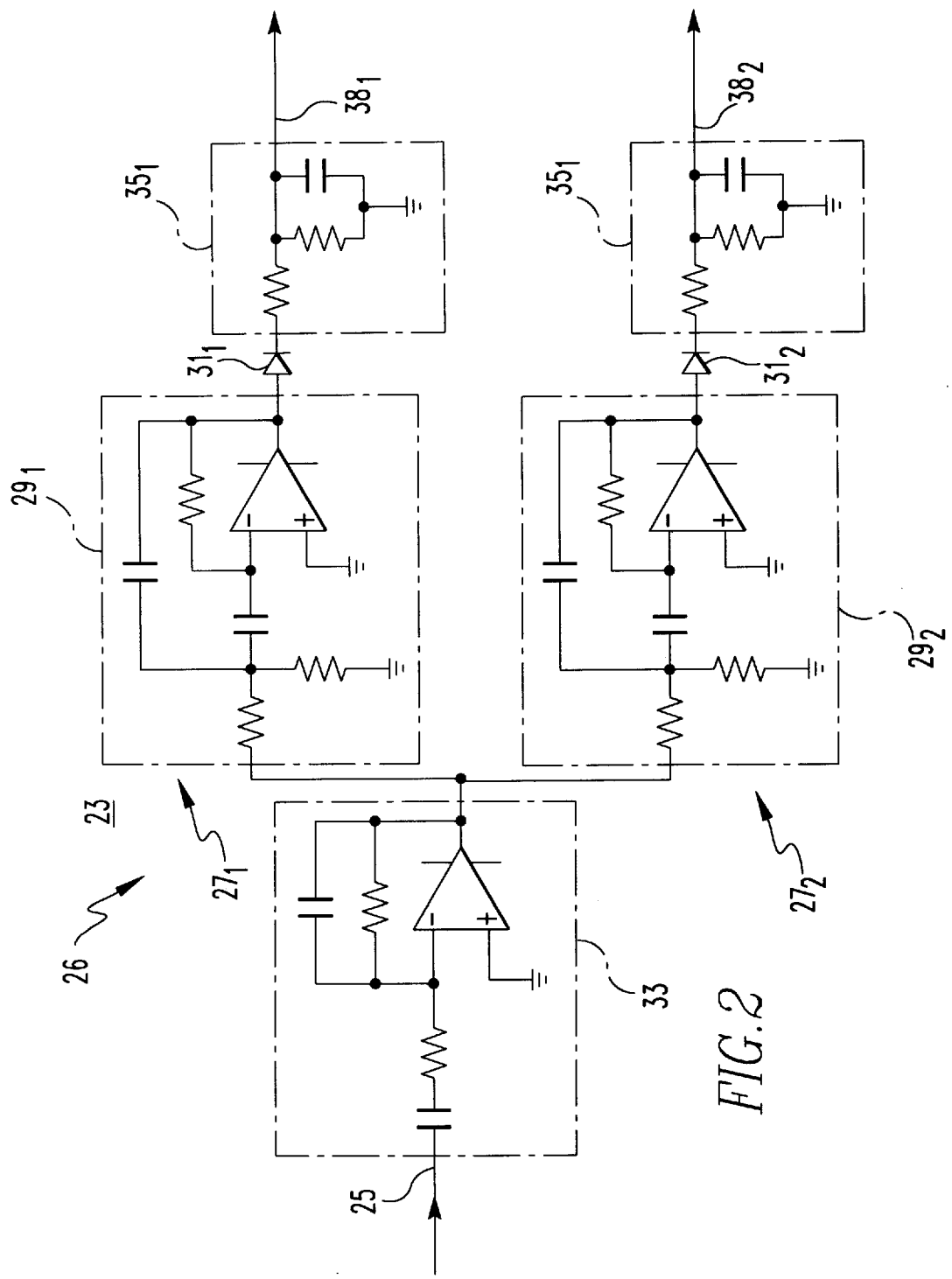
FIG. 2 is a schematic diagram of a portion of an arc fault detection circuit which forms part of the circuit breaker of FIG. 1.
Figure 3:
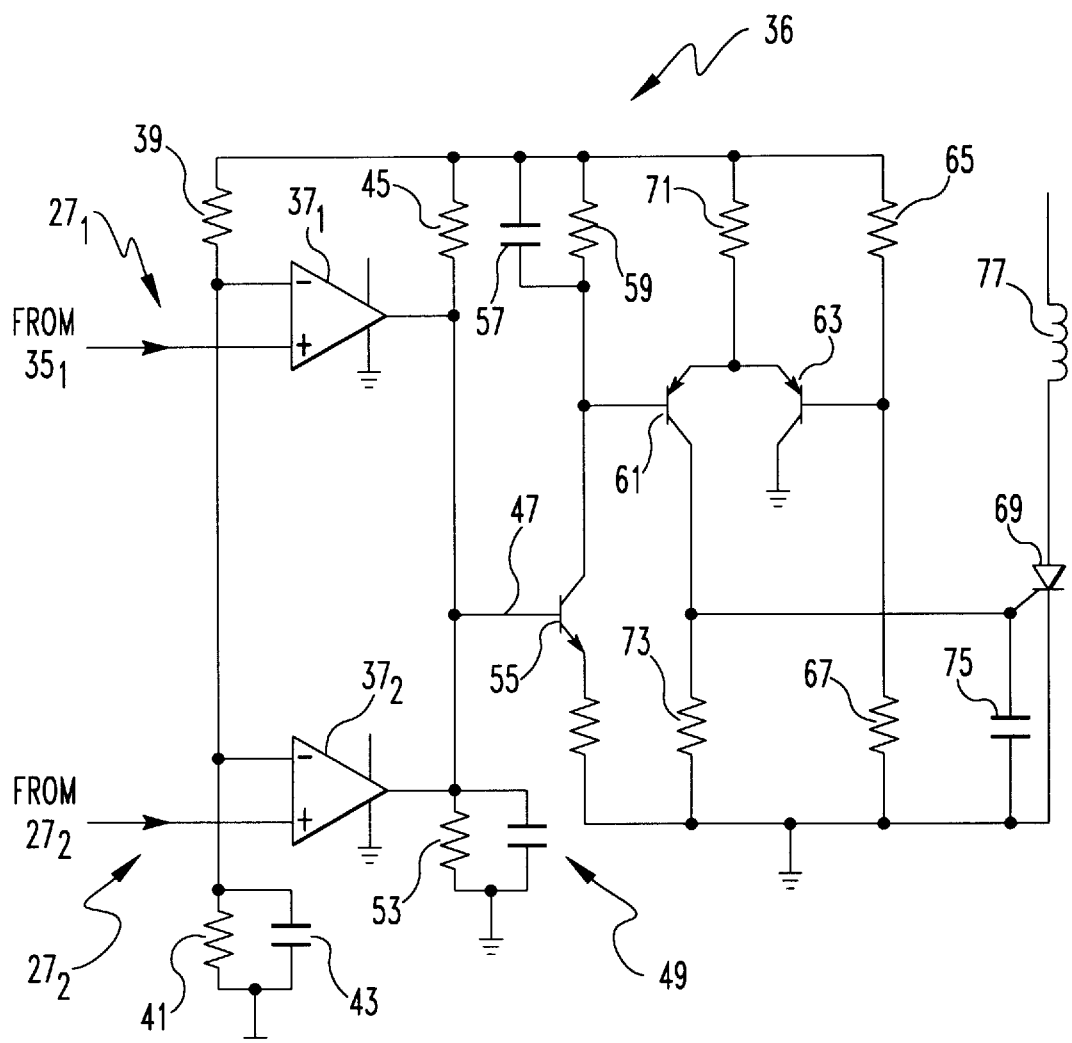
FIG. 3 is a schematic diagram of a second portion of the arc fault detection circuit.

In addition to the thermal-magnetic overcurrent device 15, which provides conventional protection, the circuit breaker 3 includes an arcing fault detector 23. This arcing fault detector 23 includes a lead 25 together with a common ground connected to sense voltage across the bimetal 17. As the resistance of the bimetal 17 is known, this voltage is a measure of the current flowing through the line conductor 5. Such a current sensor is described in U.S. Pat. No. 5,519, 561. Other types of current sensors for measuring the current through the line conductor 5 could be used. The arcing fault detector circuit 23 is shown in FIGS. 2 and 3. This arcing fault detector 23 is a multichannel bandpass filter circuit 26 which in the exemplary embodiment includes two channels $27_1$, and $27_2$. Each channel 27 includes a bandpass filter $29_1$, and $29_2$. A conventional active bandpass filter is illustrated in FIG. 2. Other types of bandpass filters, including passive filters, could be used. Each bandpass filter $29_1$, and $29_2$ has an assigned, distinct non-overlapping passband. As mentioned, an arcing fault generates broadband noise, while a carrier will have a specified frequency. Thus, each of the bandpass filters $29_1$, and $29_2$ will generate an output signal in response to an arcing fault. However, only one of the bandpass filters $29_1$, or $29_2$ can generate an output in response to a carrier signal. Of course, it is also possible that the carrier signal would not be in the passband of either of the bandpass filters $29_1$, and $29_2$ and therefore neither would generate an output signal. The point is, however, that all of the bandpass filters $29_1$, and $29_2$ will generate an output in response to an arcing fault, while a carrier signal will generate an output in only one bandpass filter. In the exemplary arcing fault detector 23, the bandpass filter $29_1$, has a center frequency of 4 KHz and the bandpass filter $29_2$ has a center frequency of 6 KHz. Each of these bandpass filters has a half power bandwidth of about 1 KHz.

In order to be assured of the rejection of multiple carriers, additional channels can be provided. In each case, the number of channels should exceed the number of carriers to be rejected by one. In other words, n+1 channels are needed to assure avoidance of false arcing fault indications from n carriers.

Returning to FIG. 2, each of the channels $27_1$, and $27_2$ further includes a detector $31_1$ and $31_2$ in the form of a diode in the exemplary circuit. Again, other types of detectors could be utilized. The arcing fault detector 23 further includes a common bandpass amplifier 33 on the front end which amplifies the incoming sensed signal on the lead 25 before it is applied to the bandpass filters 29 of the separate channels 27. This common bandpass amplifier 33 has a passband which spans the passbands of all of the bandpass filters 29. It includes an operational amplifier 33a having a high pass filter 33b on the inverting input and a low pass filter 33c providing feedback. As shown in FIG. 2, post detection low pass filters $35_1$ and $35_2$ can be provided in each channel to reduce the effects of impulse signals in the electrical system which could be associated for instance with broad spectrum type signaling.

FIG. 3 illustrates the output circuit 36 of the arcing fault detector circuit 23. In order to determine the presence of an arcing fault, the outputs of the discrete bandpass filters $29_1$, and $29_2$, are ANDed. In the embodiment of the invention shown in FIG. 3, comparators $37_1$, and $37_2$ are included in the channels $27_1$, and $27_2$, respectively. These comparators $37_1$, and $37_2$ level detect the outputs of the bandpass filters $29_1$, and $29_2$ on leads $38_1$, and $38_2$ by comparing them to a reference voltage set by the voltage divider formed by the resistors 39 and 41 powered by the V+ supply. A capacitor 43 suppresses noise in this reference signal. A common pull up resistor 45 provides the AND function on the comparator outputs. Each of the bandpass filters $29_1$, and $29_2$ must generate the output which exceeds the reference simultaneously in order to produce an ANDed signal on the lead 47. In the absence of a signal above the threshold value from either of the bandpass filters $29_1$, or $29_2$, the common output on the lead 47 will be at ground potential. When a signal with an amplitude larger than the reference voltage is applied to the non-inverting input of either comparator $37_1$, or $37_2$ its output transistor will turn off. In order to produce a signal at the common output 47, inputs must be applied to all the comparators 371 and 372 simultaneously, thus turning off the output transistors of all of the comparators 37.

Post detection filtering to eliminate impulse signals can also be provided by the low pass filter 49 on the outputs of the comparators 37. It is not essential that both the low pass filters $35_1$, and $35_2$ before the comparators 37 and the low pass filter 49 after the comparators be provided, as one or the other can be sufficient.

A resistor divider comprised of the pull up resistor 45 and a resistor 53 employed at the common comparator output limits the voltage output on the lead 47 to some small value. This ANDed signal on the lead 47 is applied to the base of the transistor 55, which when turned on provides charging current to an integrating capacitor 57. This capacitor 57 integrates the times that the channels $27_1$, and $27_2$ simultaneously detect a signal indicative of an arc. A resistor 59 provides a discharge path for the capacitor 57 thereby providing a reset for timing. The time interval for arc detection is determined by a differential pair of transistors 61 and 63 which are provided with a reference voltage established by the resistor divider formed by resistors 65 and 67. When the capacitor 57 is charged sufficiently that the potential at the base of the transistor 61 becomes more negative than the base voltage applied to the transistor 63, transistor 63 will turn off and transistor 61 will turn on, supplying gate current to the SCR 69. The resistor 71 limits the current through the transistors 61 and 63 and together with the resistor 73 determines the gate voltage applied to the SCR 69. A capacitor 75 prevents false triggering of the SCR on noise. Firing of the SCR 69 energizes the trip solenoid coil 77 which unlatches the latch 19 to trip the circuit breaker. (See FIG. 1).

Figure 4:
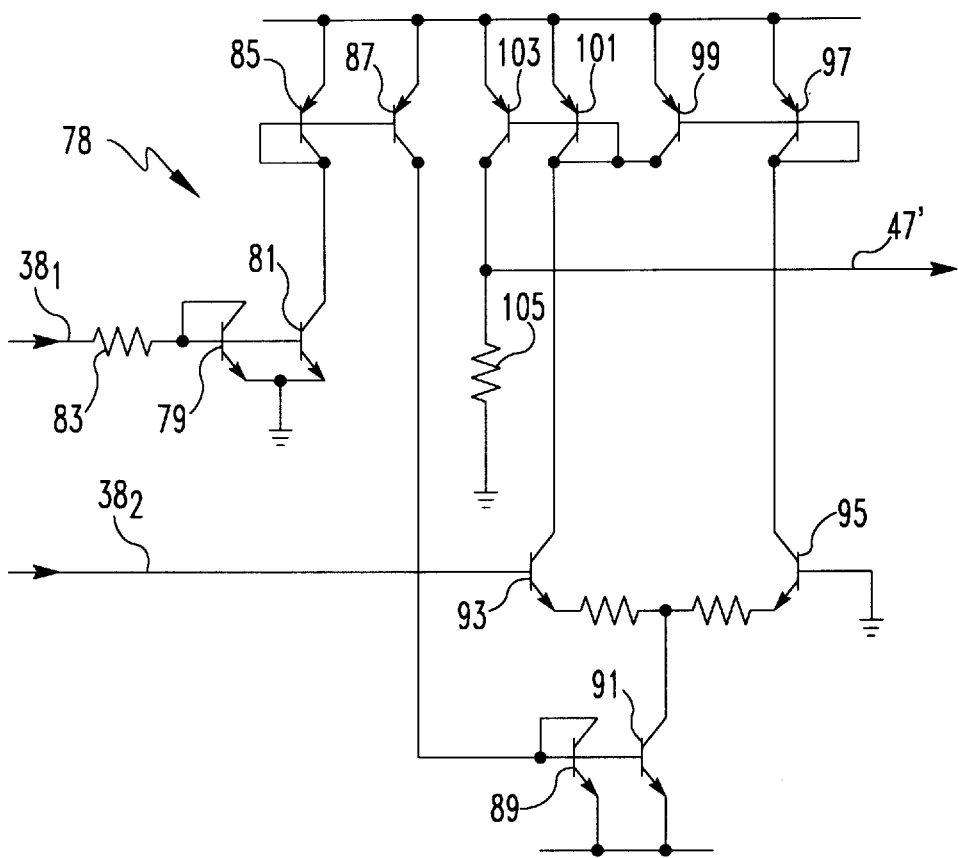
FIG. 4 is a circuit diagram of a modification to the circuit of FIG. 3 in accordance with another embodiment of the invention.

FIG. 4 illustrates an alternative, analog multiplier circuit 78 for accomplishing the ANDing of the outputs of the bandpass filters $29_1$, and $29_2$. One signal is level shifted by means of two current mirrors. For instance the signal of the lead $38_1$, is applied to a current mirror comprised of transistors 79 and 81. This signal is applied through a resistor 83, thus converting the input voltage to an input current. The mirrored current is then applied to the current mirror comprised of transistors 85 and 87. The output of this current mirror is in turn applied to another current mirror comprised of transistors 89 and 91, which determines the current in a differential amplifier formed by transistors 93 and 95.

The second signal on the lead $38_2$ is applied to the base of the transistor 93, and will thus unbalance the currents in the differential pair. As both inputs are unipolar, the first signal can increase the total current in the pair, starting at zero. The second signal can increase the current in transistor 93, while decreasing the current in transistor 95, starting from equality. Thus, both signals must be present to cause a current in transistor 93, which is greater than the current in transistor 95.

The collector currents of the differential pair 93/95 are applied to two more current mirrors formed by the transistors 97/99 and 100/103. The mirrored current of transistor 95 is subtracted from the collector current of transistor 93. The resulting difference current is then mirrored as an output current. Thus, the output current is proportional to the difference in the collector currents of transistors 93 and 95. This current will be proportional to the product of the two input signals. This output current is converted to a voltage by the means of the resistor 105 and then applied to the base of the transistor 55 in FIG. 3 by lead 47'. The resistors 107 and 109 determine the division of current between the transistors 93 and 95 and are of equal value in the exemplary embodiment of the invention. The output on lead 47' can be ANDed with signals from additional channels by using it as an input to a similar analog multiplier.

While specific embodiments of the invention have been described in detail, it will be appreciated by those skilled in the art that various modifications and alternatives to those details could be developed in light of the overall teachings of the disclosure. Accordingly, the particular arrangement disclosed are meant to be illustrative only and not limiting as to the scope of invention which is to be given the full breath of the claims appended and any and all equivalents thereof.

What is claimed is:

1. Apparatus for detecting arcing faults in an electric power system subject to power line carrier signals, said apparatus comprising:

sensing means sensing current in said electric power system and generating a sensed current signal;

multichannel bandpass filtering means bandpass filtering said sensed current signal with assigned, distinct non-overlapping passbands; and output means generating an arcing fault signal only when all channels of said multichannel bandpass filtering means detect a signal in the assigned, distinct non-overlapping passbands simultaneously.

2. The apparatus of claim 1 wherein said multichannel bandpass filtering means includes a plurality of channels each comprising a bandpass filter having one of said assigned, distinct non-overlapping passbands and a detector detecting a signal from the bandpass filter within the assigned, distinct passband of the bandpass filter, and wherein the output means comprises ANDing means connected to said detectors and generating an ANDed signal when all detectors generated an output simultaneously, and means responsive to said ANDed signal to generate said arcing fault signal.

3. The apparatus of claim 2 wherein said multichannel bandpass filtering means further comprises a common bandpass amplifier to which said sensed current signal is applied apply to generate a filtered sensed current signal which is applied to each of said bandpass filters, said common bandpass amplifier having a passband embracing the passbands of all of said plurality of bandpass filters.

4. The apparatus of claim 2 wherein said ANDing means includes means generating said ANDed signal only when all detector outputs are above a reference value.

5. The apparatus of claim 4 wherein said means responsive to said ANDed signal includes means generating said arcing fault signal only when said ANDed signal persists for a predetermined time interval.

6. The apparatus of claim 5 wherein said means generating said arcing fault signal comprises means generating a time attenuated integration of said ANDed signal and means generating said arcing fault signal when said time attenuated integration reaches a predetermined value.

7. The apparatus of claim 6 wherein said multichannel bandpass filtering means further comprises a common bandpass amplifier to which said sensed current signals apply to generate a filtered sensed current signal which is applied to each of said bandpass filters, said common bandpass amplifier having a passband embracing the passbands of all of said plurality of bandpass filters.

8. The apparatus of claim 2 wherein said output means includes at least one of low pass filtering means before said ANDing means and low pass filtering means after said ANDing means.

9. The apparatus of claim 8 wherein said ANDing means comprises a plurality of comparators to each of which one of said detector signals is applied for comparison with a reference signal, and a common pull up resistor at outputs of said plurality of comparators which provide said ANDed signal only when all of the detector signals exceed the reference signals.

10. The apparatus of claim 2 wherein said ANDing means comprises an analog multiplier to which said detector signals are applied.

11. A circuit breaker for providing protection in an electric power system subject to power line carrier signals, said circuit breaker comprising:

separable contacts connected in said electric power system;

an operating mechanism opening said separable contacts in response to a trip signal; and trip means includes an arcing fault detector comprising:

sensing means sensing current in said electric power system and generating a sensed current signal;

multichannel bandpass filtering means bandpass filtering said sensed current signal with assigned, distinct non-overlapping passbands; and output means generating a trip signal only when all channels of said multichannel bandpass filtering means detect a signal in the assigned, distinct non-overlapping passbands simultaneously.

12. The circuit breaker of claim 10 wherein said multichannel bandpass filtering means includes a plurality of channels each comprising a bandpass filter having one of said assigned, distinct non-overlapping passbands and a detector detecting a signal from the bandpass filter within the assigned, distinct passband of the bandpass filter, and wherein the output means comprises ANDing means connected to said detectors and generating an ANDed signal when all detectors generate an output simultaneously, and means generating said trip signal when said ANDed signal persists for a predetermined time interval.

13. The circuit breaker of claim 11 wherein said multichannel bandpass filtering means further includes a common bandpass amplifier amplifying said sensed current signal to generate a filtered current signal which is applied to each of said plurality of bandpass filters.

14. The circuit breaker of claim 12 wherein said output means includes at least one of a low pass filter for each detector signal before said ANDing means and low pass filter means after said ANDing means.

\* \* \* \* \*